United States Patent
Ahn

(10) Patent No.: US 9,863,986 B2
(45) Date of Patent: Jan. 9, 2018

(54) ELECTRIC POWER MEASURING SYSTEM

(71) Applicant: LSIS CO., LTD., Gyeonggi-do (KR)

(72) Inventor: Hong-Seon Ahn, Gyeonggi-do (KR)

(73) Assignee: LSIS Co., Ltd., Gyeonggi-Do (KR)

( * ) Notice: Subject to any disclaimer, the term of this patent is extended or adjusted under 35 U.S.C. 154(b) by 0 days.

(21) Appl. No.: 15/209,630

(22) Filed: Jul. 13, 2016

(65) Prior Publication Data

US 2017/0016942 A1   Jan. 19, 2017

(30) Foreign Application Priority Data

Jul. 14, 2015   (KR) .................. 10-2015-0099936

(51) Int. Cl.
| | |
|---|---|
| *G01R 1/20* | (2006.01) |
| *G01R 15/18* | (2006.01) |
| *G01R 21/133* | (2006.01) |
| *G01R 19/175* | (2006.01) |
| *G01R 21/00* | (2006.01) |

(52) U.S. Cl.
CPC ......... *G01R 21/133* (2013.01); *G01R 19/175* (2013.01); *G01R 21/002* (2013.01); *G01R 21/005* (2013.01)

(58) Field of Classification Search
CPC .. G01R 21/133; G01R 19/175; G01R 21/005; G01R 21/002
USPC ....................................... 324/76.11, 126, 127
See application file for complete search history.

(56) References Cited

U.S. PATENT DOCUMENTS

| | | | | |
|---|---|---|---|---|
| 4,709,339 A | * | 11/1987 | Fernandes | G01K 1/024 324/127 |
| 5,006,846 A | * | 4/1991 | Granville | G01R 15/183 324/126 |
| 2002/0013668 A1 | | 1/2002 | Maruyama | |
| 2013/0085692 A1 | | 4/2013 | Lee et al. | |

FOREIGN PATENT DOCUMENTS

| | | |
|---|---|---|
| EP | 0 853 364 A2 | 7/1998 |
| JP | H 06-177760 A | 6/1994 |
| JP | 2002-112411 A | 4/2002 |
| JP | 2005-081264 A | 3/2005 |
| JP | 2005-189012 A | 7/2005 |
| JP | 2009-222433 A | 10/2009 |

(Continued)

OTHER PUBLICATIONS

European Search Report dated Nov. 30, 2016 issued in corresponding European Application No. 16 17 3619.

*Primary Examiner* — Farhana Hoque
(74) *Attorney, Agent, or Firm* — K&L Gates LLP

(57) ABSTRACT

Embodiments of an electric power measuring system capable of computing accurate electric power information using a low voltage measuring instrument in a small-scale electric power system are provided. The electric power measuring system may include a first measuring instrument for measuring and detecting a current and a zero-cross point from a distribution line and for generating and outputting current information of the distribution line from the current and the zero-cross point, and a second measuring instrument for computing electric power information of the distribution line according to a voltage thereof and the current information output from the first measuring instrument.

5 Claims, 3 Drawing Sheets

(56) References Cited

FOREIGN PATENT DOCUMENTS

| | | |
|---|---|---|
| KR | 10-2004-0066708 A | 7/2004 |
| KR | 10-2005-0069641 A | 5/2006 |
| KR | 10-2013-0073659 A | 7/2013 |

* cited by examiner (PRIOR ART)

ELECTRIC POWER MEASURING SYSTEM

CROSS REFERENCE TO RELATED APPLICATIONS

This application claims the benefit of Korean Patent Application No. 10-2015-0099936, filed on Jul. 14, 2015 entitled "ELECTRIC POWER MEASURING SYSTEM", which is hereby incorporated by reference in its entirety.

BACKGROUND

Technical Field

The present disclosure relates to an electric power measuring system, and more particularly, to an electric power measuring system capable of computing accurate electric power information using a low voltage measuring instrument in a small-scale electric power system.

Description of the Related Art

Generally, an electric power measuring system measures a voltage and a current flowing at an electric power system in a distribution panel or a panel board, that is, a load of a distribution line to compute electric power information such as electric energy and the like through various computations.

The electric power measuring system includes a measuring instrument for measuring a voltage and an amount of a current from a distribution line to generate various measuring information. The measuring instrument is classified into a high voltage measuring instrument and a low voltage measuring instrument.

The high voltage measuring instrument measures all of a voltage and an amount of a current from a distribution line to generate first data, for example, data including voltage information, current information, power factor information and the like, and processes the first data to generate second data, for example, electric power information of the distribution line. The low voltage measuring instrument measures one of a voltage and an amount of a current from a distribution line to generate first data.

Meanwhile, in a small-scale distribution panel or panel board, an electric power measuring system is established with only a low voltage measuring instrument due to a manufacture cost factor. And, the low voltage measuring instrument measures one of a voltage and an amount of a current of a distribution line and generates first data according to the measurement to transmit the first data to an external side through a communication.

FIG. 1 is a diagram schematically illustrating a configuration of a typical electric power measuring system.

As shown in FIG. 1, a typical electric power measuring system 1 includes a low voltage measuring instrument, that is, a current measuring instrument 20 which measures a current from a distribution line 10 to generate current information I in a distribution panel or a panel board.

In the distribution line 10 configured with a three-phase balanced line having phase terminals of an R-phase, an S-phase, and a T-phase, the current measuring instrument 20 measures a current value with respect to one of the R-, S-, and T-phases. The current measuring instrument 20 generates the current information I of the distribution line 10 from the measured current value to transmit the current information I to an integrated measuring instrument 30 of an external side through a communication.

The integrated measuring instrument 30 computes electric power information P of the distribution line 10 from the current information I transmitted from the current measuring instrument 20 on the basis of voltage information V, for example, alternating current (AC) voltage information of the distribution line 10, provided from the external side. The electric power information P is information regarding an AC electric energy.

As described above, in the typical electric power measuring system 1, the current measuring instrument 20 is installed inside the distribution panel or the panel board, and the current information I of the distribution line 10 is transmitted from the current measuring instrument 20 to the integrated measuring instrument 30 of the external side to compute the electric power information P of the distribution line 10.

In the typical electric power measuring system 1, however, when the current measuring instrument 20 transmits the current information I to the integrated measuring instrument 30, a problem in which a phase of the current information I is not synchronized with that of the voltage information V may occur due to a time delay and the like.

As a result, when the integrated measuring instrument 30 computes the electric power information P of the distribution line 10, a phase error between the voltage and the current may occur in the typical electric power measuring system 1. Consequently, it is difficult to accurately compute the electric power information P of the distribution line 10 to cause a problem in which reliability of the typical electric power measuring system 1 is degraded.

SUMMARY

Therefore, to address the problems described above, an object of some embodiments of the present disclosure is to provide an electric power measuring system capable of computing accurate electric power information of a distribution line using a current measuring instrument installed inside a distribution panel or a panel board.

An electric power measuring system according to one embodiment of the present disclosure includes a first measuring instrument configured to measure and detect a current and a zero-cross point from a distribution line and to generate and output current information of the distribution line from the current and the zero-cross point, and a second measuring instrument configured to compute electric power information of the distribution line according to a voltage thereof and the current information output from the first measuring instrument.

The first measuring instrument may convert a phase of the current from the zero-cross point and generate the current information including a magnitude of the current and the converted phase thereof.

The first measuring instrument may include a measurement unit configured to measure the current from the distribution line, a converter configured to convert the current into digital data, a zero-cross detector configured to detect and output one or more zero-cross points from the voltage of the distribution line, a main processor (MCU) configured to compute the magnitude of the current and an absolute phase thereof from the digital data, convert the absolute phase of the current into a relative phase thereof according to the one or more zero-cross points, and generate and output the current information including the magnitude of the current and the relative phase thereof, and a communication unit configured to transmit the current information to the second measuring instrument.

The first measuring instrument may further include a power generator connected to the distribution line to generate an operational power of the first measuring instrument.

The zero-cross detector may detect the one or more zero-cross points with respect to the voltage provided from the distribution line to the power generator.

The second measuring instrument may compute an apparent power by multiplying the voltage by the magnitude of the current, calculate an active power of the distribution line by multiplying the apparent power by the relative phase of the current, and generate the electric power information including the active power.

An electric power measuring system of some embodiments of the present disclosure detects a zero-cross point of a distribution line through a zero-cross detector provided in a current measuring instrument. And, using the detected zero-cross point, a phase of a current measured at the distribution line may be converted into a relative phase between the current and a voltage.

Consequently, phases of the voltage and the current measured at the distribution line are exactly synchronized with each other, such that an integrated measuring instrument may generate accurate electric power information of the distribution line to improve a measurement reliability of the electric power measuring system.

Also, the electric power measuring system of some embodiments of the present disclosure computes and transmits the relative phase between the current and the voltage of the distribution line through the current measuring instrument, such that a computation amount of the integrated measuring instrument may be drastically reduced in comparison with the typical electric power measuring system.

DETAILED DESCRIPTION

Hereinafter, an electric power measuring system according to some embodiments of the present disclosure will be described in detail with reference to the accompanying drawings.

Figure 1:
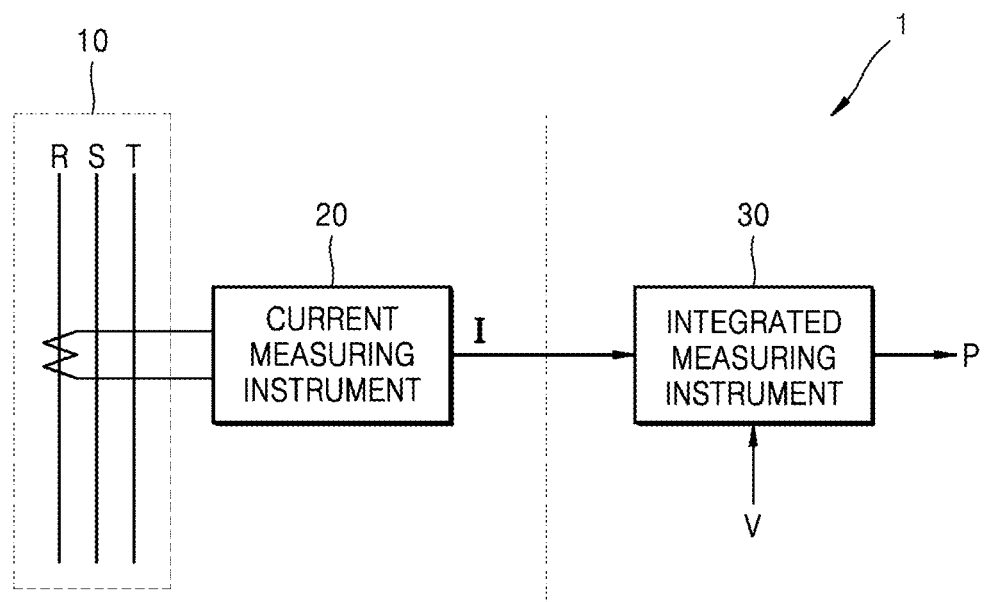
FIG. 1 is a diagram schematically illustrating a configuration of a typical electric power measuring system, according to the prior art.
Figure 2:
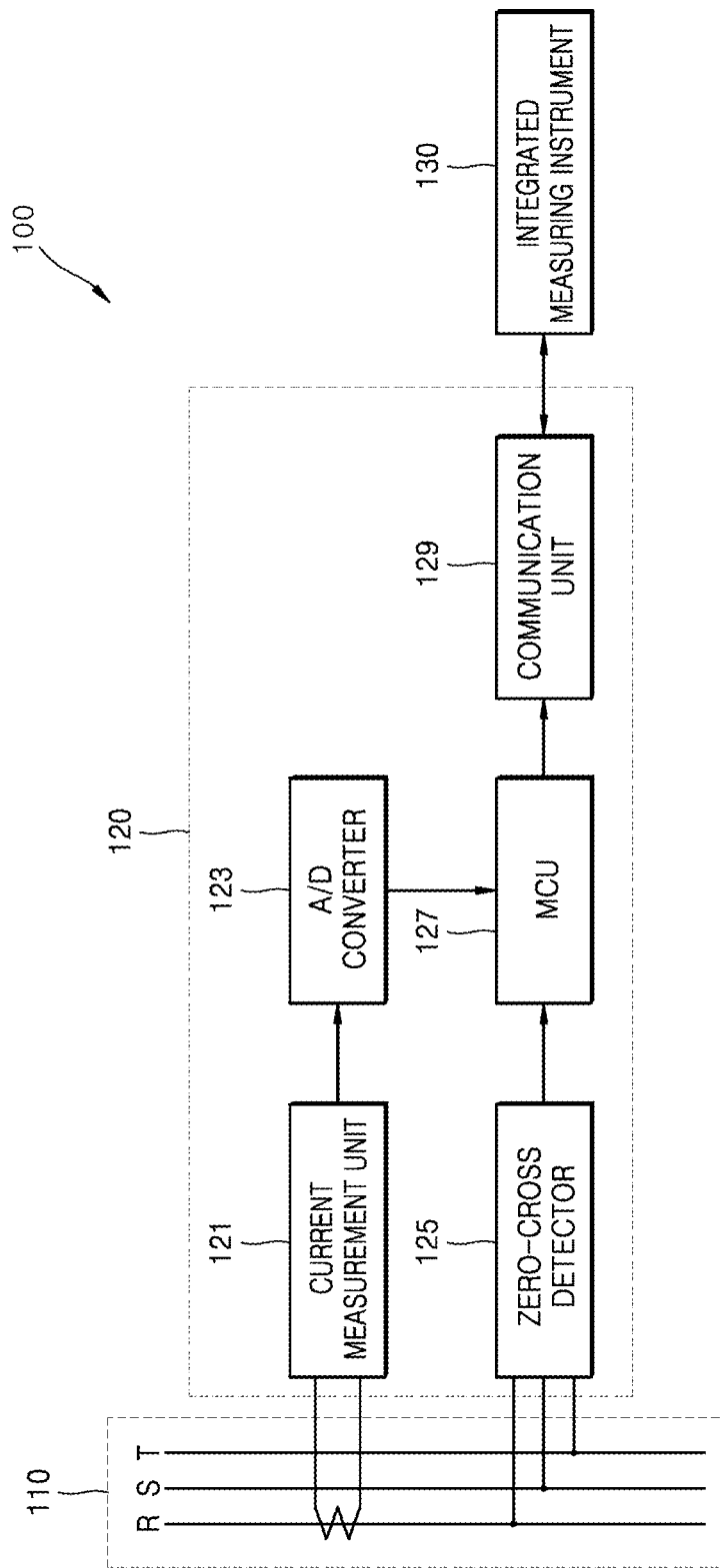
FIG. 2 is a diagram schematically illustrating a configuration of an electric power measuring system, according to an embodiment of the present disclosure.

FIG. 2 is a diagram schematically illustrating a configuration of an electric power measuring system according to an embodiment of the present disclosure.

With reference to FIG. 2, an electric power measuring system 100 may include a current measuring instrument 120 and an integrated measuring instrument 130 which are connected to each other through wire/wireless communication networks (not shown) to perform a data communication.

One or more current measuring instruments 120 may be installed inside a panel board or a distribution panel. The current measuring instrument 120 may generate current information according to a current measured from a distribution line 110 inside the panel board or the distribution panel to transmit the current information to the integrated measuring instrument 130.

The distribution line 110 may be a three-phase balanced line including phase terminals of an R-phase, an S-phase, and a T-phase, but it is not limited thereto. And, the current measuring instrument 120 may measure a current of one of the R-, S-, and T-phases of the distribution line 110 to compute current information thereof based on the measured current.

The current measuring instrument 120 may include a current measurement unit 121, an analog-digital converter (hereinafter, referred to as an A/D converter) 123, a zero-cross detector 125, a main processor (hereinafter, referred to as an MCU) 127, and a communication unit 129.

The current measurement unit 121 may measure a current flowing at a load (not shown) from the distribution line 110 to output an amount of a current, for example, a current value in a form of analog data according to the measured current.

The A/D converter 123 may convert the current value output from the current measurement unit 121 from analog to digital to output current data in a form of digital data. The A/D converter 123 may sample the current value from the current measurement unit 121 to convert the sampled current value into the digital data.

The MCU 127 may compute a magnitude of the current and a phase thereof, for example, an absolute phase of the current flowing at the distribution line 110 from the current data output from the A/D converter 123.

Also, the MCU 127 may convert the computed absolute phase of the current into a relative phase between the current and a voltage according to a zero-cross point output from the zero-cross detector 125 which is to be described later.

And, the MCU 127 may generate current information of the distribution line 110, which includes the computed magnitude of the current and the relative phase thereof.

The zero-cross detector 125 may detect and output one or more zero-cross points from the distribution line 110. The zero-cross detector 125 may detect and output a voltage of the distribution line 110, that is, a point at which an instantaneous value of an induced voltage of the distribution line 110 is '0' as a zero-cross point. The zero-cross point may be output to the MCU 127.

The communication unit 129 may transmit the current information of the distribution line 110, which is output from the MCU 127, to the integrated measuring instrument 130. The communication unit 129 may be configured with one of a power line communication modem, an RS-485 serial communication modem, a radio frequency (RF) modem, and a Zigbee modem.

The integrated measuring instrument 130 may compute electric power information of the distribution line 110 from the current information transmitted from the current measuring instrument 120. The integrated measuring instrument 130 may receive information regarding a magnitude of the voltage of the distribution line 110 to compute the electric power information regarding an induced power of the distribution line 110 from the current information transmitted from the current measuring instrument 120 using the received information.

Figure 3:
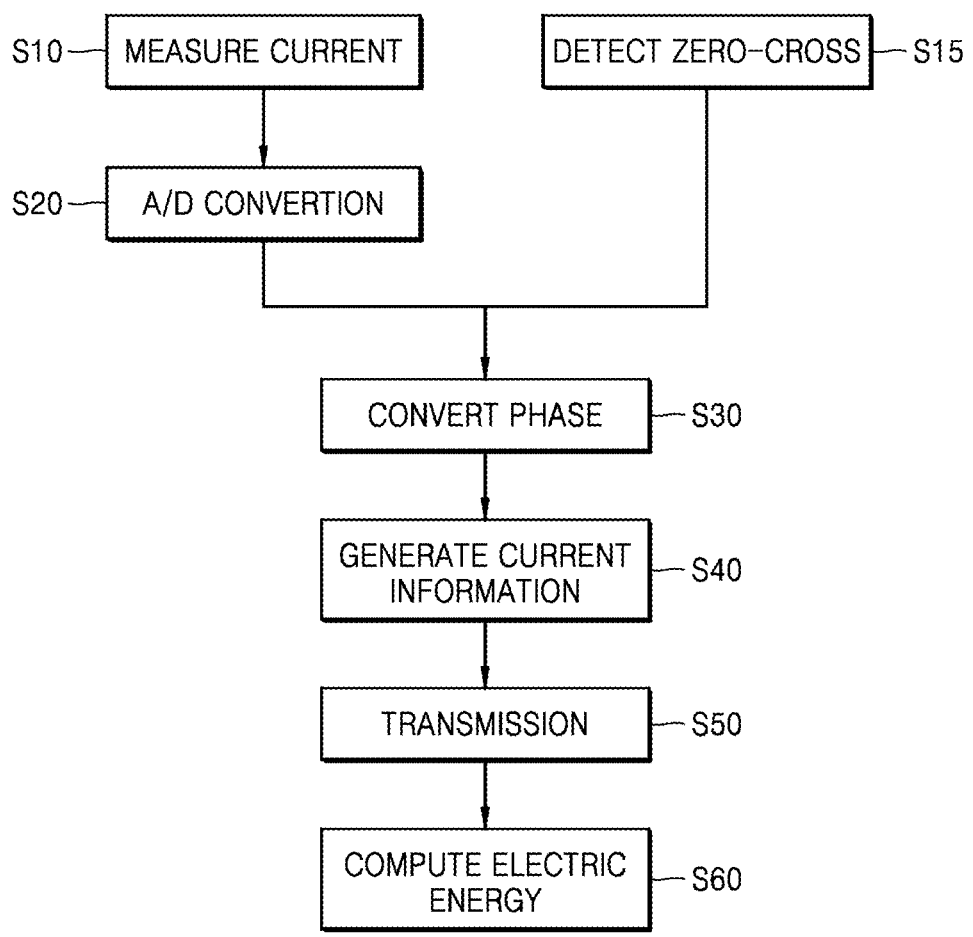
FIG. 3 is a flow chart illustrating an operation of the electric power measuring system shown in FIG. 2, according to an embodiment of the present disclosure.

FIG. 3 is a flow chart illustrating an operation of the electric power measuring system shown in FIG. 2.

Hereinafter, with reference to FIGS. 2 and 3, an operation of computing electric power information of a distribution line in the electric power measuring system of some embodiments of the present disclosure will be described in detail.

Firstly, the current measurement unit 121 of the current measuring instrument 120 may measure a current from the distribution line 110 to output a current value in a form of analog data in Operation S10.

Also, the A/D converter 123 of the current measuring instrument 120 may convert the current value output from the current measurement unit 121 into digital data to output current data in Operation S20.

And, the zero-cross detector 125 of the current measuring instrument 120 may detect and output one or more zero-cross points from the distribution line 110 in Operation S15.

For example, the current measuring instrument 120 may further include a power generator (not shown) for generating an operational power capable of operating all components of the current measuring instrument 120 from the distribution line 110. And, the zero-cross detector 125 may detect and output a zero-cross point regarding a voltage of the distribution line 110, that is, an induced voltage flowing at the distribution line 110 from one or more lines extending from the distribution line 110 to the power generator. Here, the current measurement unit 121 and the zero-cross detector 125 may operate at the same time.

The MCU 127 of the current measuring instrument 120 may compute a magnitude and an absolute phase of the current of the distribution line 110 from the current data output from the A/D converter 123. Thereafter, the MCU 127 may convert the absolute phase of the current into a relative phase between the current and the voltage using the zero-cross point output from the zero-cross detector 125 in Operation S30.

And, the MCU 127 may generate and output current information, which includes the magnitude of the current computed from the current information and the relative phase of the current generated from the zero-cross point, of the distribution line 110 in Operation S40.

The communication unit 129 of the current measuring instrument 120 may transmit the current information of the distribution line 110, which is generated in the MCU 127, to the integrated measuring instrument 130 through wire/wireless communication networks in Operation S50.

The integrated measuring instrument 130 may generate electric power information of the distribution line 110 from voltage information of the distribution line 110, which is provided from an external side, and the current information thereof, which is transmitted from the current measuring instrument 120, in Operation S60.

For example, the integrated measuring instrument 130 may compute an apparent power of the distribution line 110 by multiplying a magnitude of the voltage of the voltage information by the magnitude of the current of the current information. And, by multiplying the computed apparent power by the relative phase cos Φ of the current information, an active power of the distribution line 110 may be computed. The integrated measuring instrument 130 may output the electric power information of the distribution line 110, which includes the active power.

As described above, the electric power measuring system 100 of some embodiments of the present disclosure may detect the zero-cross point of the distribution line 110 through the zero-cross detector 125 provided in the current measuring instrument 120 to convert the phase of the current measured at the distribution line 110 into the relative phase between the current and the voltage using the detected zero-cross point.

Consequently, phases of the voltage and the current measured at the distribution line 110 are exactly synchronized with each other, such that the integrated measuring instrument 130 may generate accurate electric power information of the distribution line 110.

In other words, a measuring reliability of the electric power measuring system 100 may be improved.

Also, the electric power measuring system 100 of some embodiments of the present disclosure computes and transmits the relative phase between the current and the voltage of the distribution line 110 through the current measuring instrument 120, such that a computation amount of the integrated measuring instrument 130 may be drastically reduced in comparison with the typical electric power measuring system.

Although the description has been set forth in detail, it should be construed as illustrative embodiments not to be taken in a sense for limiting the scope of the present disclosure. Therefore, the scope of the present disclosure should be construed by the appended claims, along with the full range of equivalents and to which such claims are entitled.

While certain embodiments have been described, these embodiments have been presented by way of example only, and are not intended to limit the scope of the protection. Indeed, the novel methods and systems described herein may be embodied in a variety of other forms. Furthermore, various omissions, substitutions and changes in the form of the methods and systems described herein may be made without departing from the spirit of the protection. The accompanying claims and their equivalents are intended to cover such forms or modifications as would fall within the scope and spirit of the protection. Various components illustrated in the figures may be implemented as hardware and/or software and/or firmware on a processor, ASIC/FPGA, dedicated hardware, and/or logic circuitry. Also, the features and attributes of the specific embodiments disclosed above may be combined in different ways to form additional embodiments, all of which fall within the scope of the present disclosure. Although the present disclosure provides certain preferred embodiments and applications, other embodiments that are apparent to those of ordinary skill in the art, including embodiments which do not provide all of the features and advantages set forth herein, are also within the scope of this disclosure. Accordingly, the scope of the present disclosure is intended to be defined only by reference to the appended claims.

What is claimed is:

1. An electric power measuring system computing electric power information of a distribution line, comprising:
   a first measuring instrument configured to measure a current from the distribution line, detect a zero-cross point from the voltage of the distribution line, convert an absolute phase of the current into a relative phase between the current and the voltage thereof according to the zero-cross point, and generate and output current information of the distribution line including a magnitude of the current and the relative phase; and
   a second measuring instrument configured to compute the electric power information of the distribution line according to a voltage thereof and the current information output from the first measuring instrument.

2. The electric power measuring system of claim 1, wherein the first measuring instrument includes:
   a measurement unit configured to measure the current from the distribution line;
   a converter configured to convert the current into digital data;
   a zero-cross detector configured to detect and output one or more zero-cross points from the voltage of the distribution line;
   a main processor (MCU) configured to compute a magnitude of the current and an absolute phase thereof from the digital data, convert the absolute phase of the current into a relative phase thereof according to the one or more zero-cross points, and generate and output the current information including the magnitude of the current and the relative phase thereof; and a communication unit configured to transmit the current information to the second measuring instrument.

3. The electric power measuring system of claim 2, wherein the first measuring instrument further includes a power generator connected to the distribution line to generate an operational power of the first measuring instrument.

4. The electric power measuring system of claim 3, wherein the zero-cross detector detects the one or more zero-cross points with respect to a voltage provided from the distribution line to the power generator.

5. The electric power measuring system of claim 2, wherein the second measuring instrument computes an apparent power by multiplying the voltage by the magnitude of the current, calculates an active power of the distribution line by multiplying the apparent power by the relative phase of the current, and generates the electric power information including the active power.

* * * * *